Figure 1:
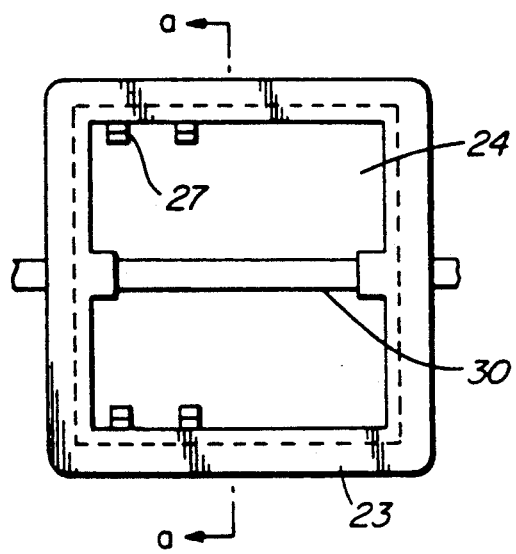

United States Patent [19]

Van-Santbrink et al.

[11] Patent Number: 5,035,641
[45] Date of Patent: Jul. 30, 1991

[54] TERMINATING INSULATED CONDUCTORS

[75] Inventors: Ronald Van-Santbrink, Muiden, Netherlands; John C. Collier, Southport; David Lee, Goldbourne, both of United Kingdom

[73] Assignee: ITT Industries Limited, Basingstoke, United Kingdom

[21] Appl. No.: 438,484

[22] PCT Filed: Feb. 13, 1989

[86] PCT No.: Pct/GB89/00135
  § 371 Date: Dec. 15, 1989
  § 102(e) Date: Dec. 15, 1989

[87] PCT Pub. No.: WO89/07849
  PCT Pub. Date: Aug. 24, 1989

[30] Foreign Application Priority Data

Feb. 15, 1988 [GB] United Kingdom ............... 8803448
Mar. 18, 1988 [NL] Netherlands ..................... 8800674

[51] Int. Cl.$^5$ .............................................. H01R 9/09
[52] U.S. Cl. ..................................... 439/329; 439/67; 439/567
[58] Field of Search ........................ 439/59, 60, 61, 67, 439/77, 329, 493, 629, 630, 631, 632, 567, 676

[56] References Cited

U.S. PATENT DOCUMENTS

| 3,436,715 | 4/1969 | Matthews | 439/329 |
| 3,633,152 | 1/1972 | Podmore | 439/329 |
| 4,221,458 | 9/1980 | Hughes et al. | 439/79 |
| 4,373,764 | 2/1983 | Ulrich | 29/854 |
| 4,379,606 | 4/1983 | Clark et al. | 439/490 |
| 4,695,112 | 9/1987 | Maston | 439/629 |

FOREIGN PATENT DOCUMENTS

| 262432 | 4/1988 | European Pat. Off. . |
| 1143559 | 6/1961 | Fed. Rep. of Germany . |
| 1929219 | 1/1970 | Fed. Rep. of Germany . |
| 3112362 | 10/1982 | Fed. Rep. of Germany . |
| 1144663 | 5/1969 | United Kingdom . |

Primary Examiner—Neil Abrams
Attorney, Agent, or Firm—Thomas L. Peterson

[57] ABSTRACT

A plug and socker connector for a printed circuit board has the socket part open at the bottom so that it can be attached to the board by latches engaging in openings in the board, leaving conductive tracks on the board exposed within the socket part. A plug has external resilient contacts so that when the plug is inserted in the socket, the contacts press against the conductive tracks of the board. Other fastening means for holding the socket against the board are disclosed, and the socket can be double so that a plug can be inserted on either side of the board.

5 Claims, 3 Drawing Sheets

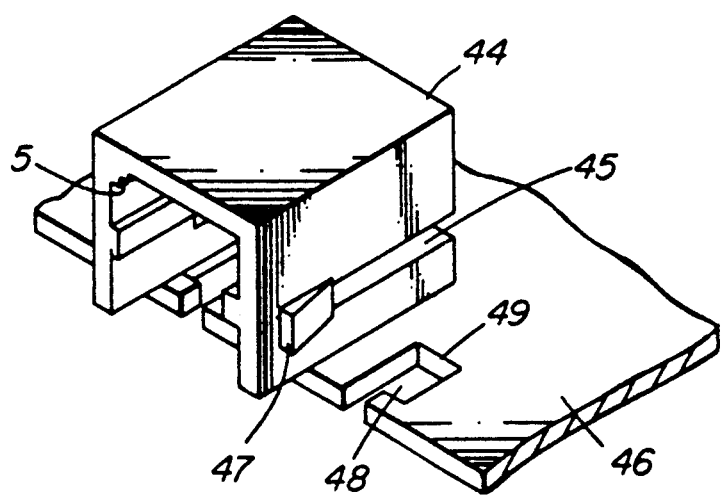
FIG. 7
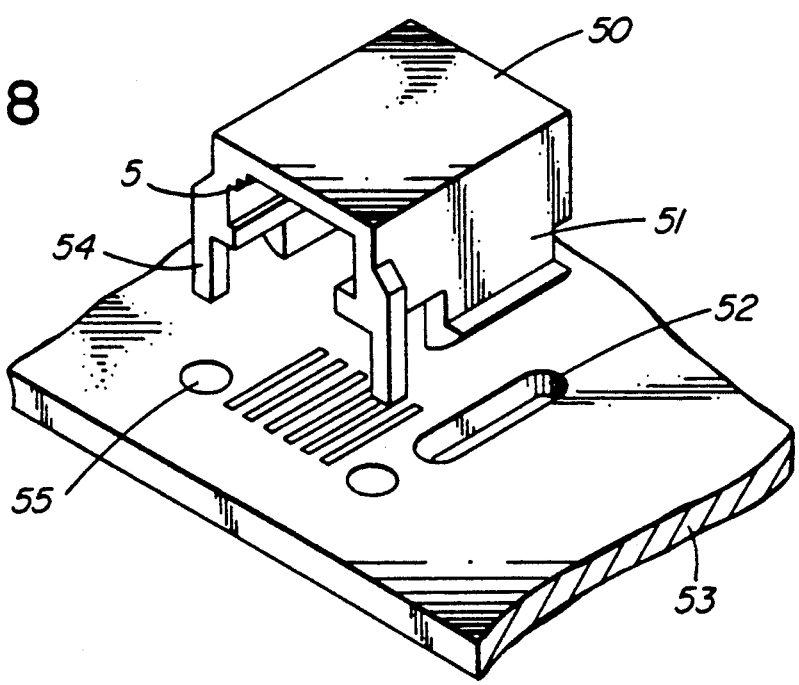
FIG. 8
FIG. 9
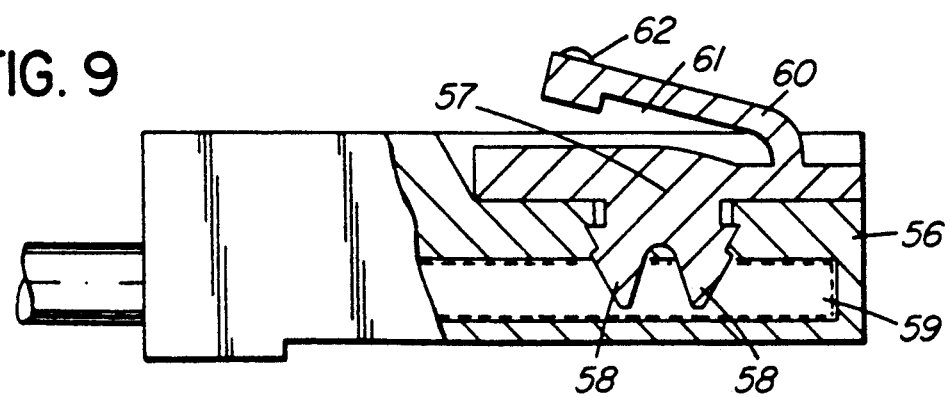

TERMINATING INSULATED CONDUCTORS

This invention relates to electrical connectors for the termination of insulated conductors and their interconnection to further electrical contacts. The term insulated conductor is herein meant to include solid conductors and stranded conductors together with other types of conductors such as tinsel conductors, whenever insulated by a covering of insulating material. The invention particularly relates to electrical connectors for making an electrical connection between one or more insulated conductors and one or more contacts on a printed circuit board. Such contacts are normally in the form of conductive tracks on the board.

It is known to provide a plug and socket connector for the interconnection of an electronic circuit installed on a base plate such as a printed circuit board which connector comprises a plug-in part with contact members which extend from a side thereof and which co-operate with opposing-contact members in a housing intended for the reception of the plug-in part.

In the case of this known plug and socket connection, the opposing-contact members are formed on a part of the housing itself, so that it is necessary to re-connect these contact members to pertinent contact members of the base plate with the printed circuitry which forms part of the electronic circuit.

In a known manner of connecting the known plug connection to the base plate, the latter has to be provided with a protruding lip on which the housing to receive the plug connector has to be fitted.

Because of the presence of this lip on the base plate, there is a deviation from the simple rectangular shape of the latter, so that it is necessary, for the production of the base plate, to saw or mill a section from sheet material, such as pertinax sheets, glass epoxy resin sheets and the like, which process is relatively complicated and costly in comparison with the production of a base plate which is simply rectangular, and which, by scratching and then breaking off, can be obtained from sheet material.

Moreover, the presence of the opposing-contact members on a part of the housing itself requires the extra process of the connection of these contact members to the circuit itself.

An object of the invention is to obviate these defects of the known plug and socket connector.

According to the invention in its broadest aspect there is provided an electrical plug and socket connector for the connection of an external conductor to an electronic circuit installed on a base plate with printed circuitry, comprising a plug-in part with contact members extending from the side thereof which co-operate with opposed-contact members within a housing intended for the reception of the inserted plug-in part, whereon the opposed-contact members are formed on or in the base plate and are bridged by the housing which is open towards the base plate in such a way that, with the introduction of the plug-in part into the housing, the co-operating contact members are connected to corresponding opposed-contact members on the base plate.

Thus, in the case of a plug and socket connection according to the invention, no opposite-contact members are installed on the housing itself, and this housing serves more as a guide into which the plug-in part can be introduced, so that the contact members are brought directly into communication with the opposing-contact members which are disposed on the base plate itself and form part of the printed circuitry. As a result of this construction, a considerable saving is obtained with regard to the production of the base plate itself, since a simple rectangular shape can be used, and because electrical connection of the socket connector itself to the printed circuitry of the base plate no longer need take place.

According to another aspect of the invention there is provided an electrical plug and socket connector for the connection of an external conductor to an electrical circuit installed on a base plate with printed circuitry comprising a plug-in part with contact members extending from a side thereof which co-operate with opposed-contact members within a housing intended for the reception of the inserted plug-in part, in which the contact members in the plug-in part each have a terminating portion adapted to pierce the insulation and make an electrical connection with a conductor of an insulated cable terminating in the plug-in part and a unitary contact-engaging portion including a resilient conductive cantilever arm to co-operate with a respective contact member within the housing.

Figure 2:
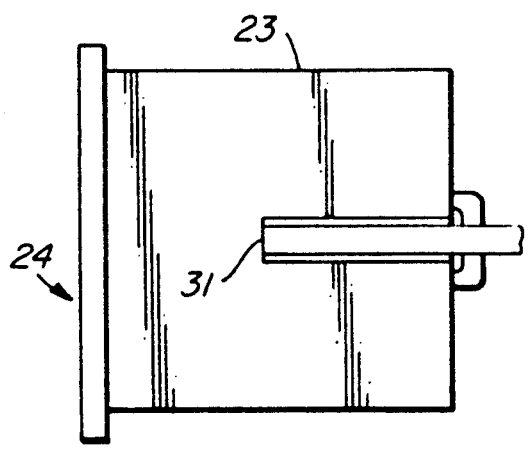
Figure 3:
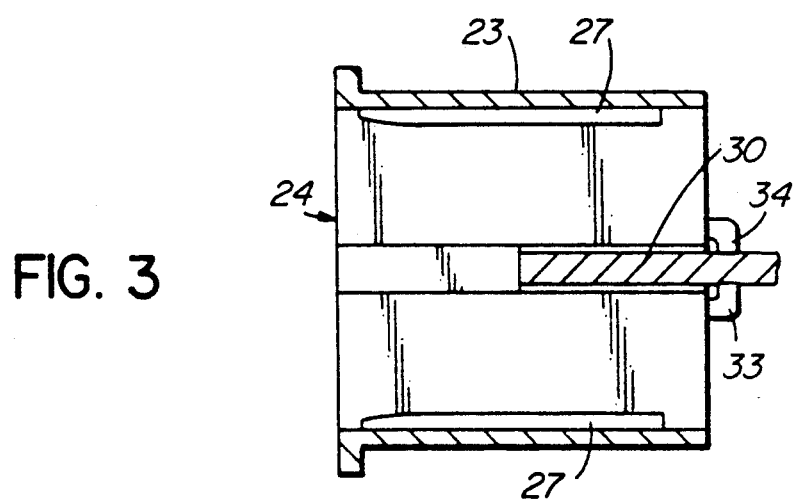
Figure 4:
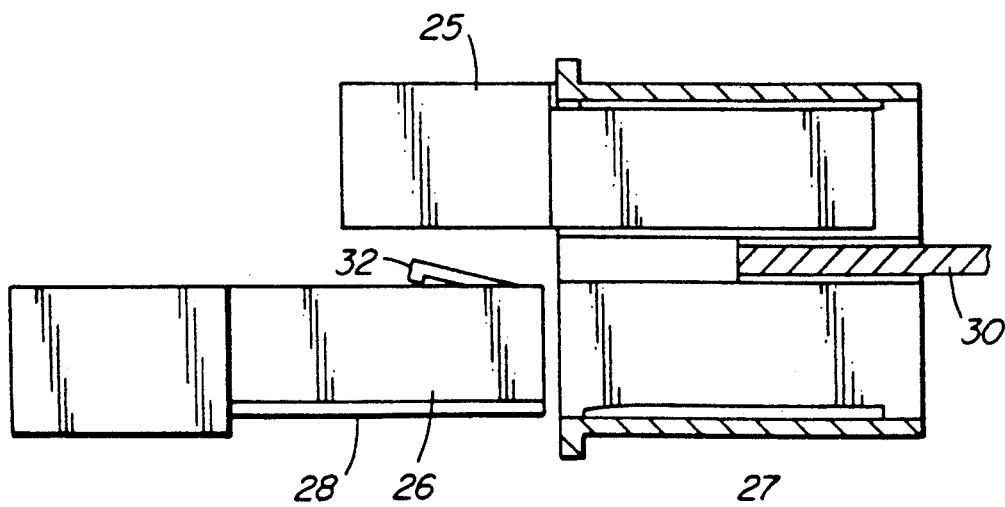

Embodiments of the invention will now be described by way of example with reference to the accompanying drawings, in which:

FIG. 1 is a front view of a first embodiment, as seen from the plug-introduction side of the housing, FIG. 2 is a side view of the housing according to FIG. 1, FIG. 3 is a cross-section along the line a—a of FIG. 1, FIG. 4 is the same cross-section as that according to FIG. 3 but with an inserted plug in the topmost part of the housing, and a second plug disposed in front of the insertion aperture of the bottommost part of the housing, FIGS. 5 to 8 are perspective views of further embodiments, and FIG. 9 is a diagrammatic sectional view of the plug part of the connector showing the preferred form of contact element.

In the arrangement shown generally in FIGS. 1 to 4, a box-like housing 23 has a flanged opening 24 into which two oppositely-directed connector bodies or plugs 25, 26 can be inserted. The housing is formed with assymetrical rails 27 co-operating with similarly-disposed slots 28 on the bodies 25,26 to assist insertion and ensure that the connector bodies are inserted in their correct positions relative to the housing and each other. Other forms of keying or splining can be used and the connector bodies can be provided with resilient clips or the like in order to retain the plugs in the housing.

A printed circuit board or similar base plate 30 is inserted into the opposite end of the housing from the opening 24, slots 31 being provided to limit the amount of insertion and ensure that contacts 32 on the connector bodies 25,26 mate with corresponding conductive tracks or surfaces on both sides of the printed circuit board or base plate.

Lateral positioning of the board 30 can be ensured by, for example, the use of a member such as 33 secured to the rear of the housing 23 and provided with projections 34 engaging in depressions in the board.

It is assumed that each of the plugs 25,26 is of the kind which has a plurality of parallel contact elements embedded in an insulating block, each contact element having a terminating portion adapted to make an electrical connection with a conductor of an insulated cable inserted in the block and a contact-engaging portion adapted to make resilient electrical contact with a respective track on the printed circuit board. A preferred form of contact element for this purpose—applicable to all the embodiments herein—is shown in FIG. 9 and will now be described.

Part of the insulating block is shown at 56 having embedded therein a contact element 57. The latter is provided with tines 58 which are adapted to pierce the insulation of an inserted cable shown diagrammatically at 59 and thereby to make connection with the conductor. The contact element is formed in one piece with a resilient contact-engaging portion 60 in the form of a cantilever arm spaced away from the rest of the contact element by a slot 61. The portion 60 may be formed with a nose or projection 62 to increase contact with the track on the printed circuit board, which is assumed to be inserted at the top of FIG. 9. In other words, the connector shown is assumed to be the lower of the plugs, 26, in FIG. 4.

FIGS. 5 to 8 show how a single connector body or plug of the kind already described can be attached to a printed circuit board so that the contacts therein mate with conductive tracks or surfaces on one side of the board only.

Figure 5:
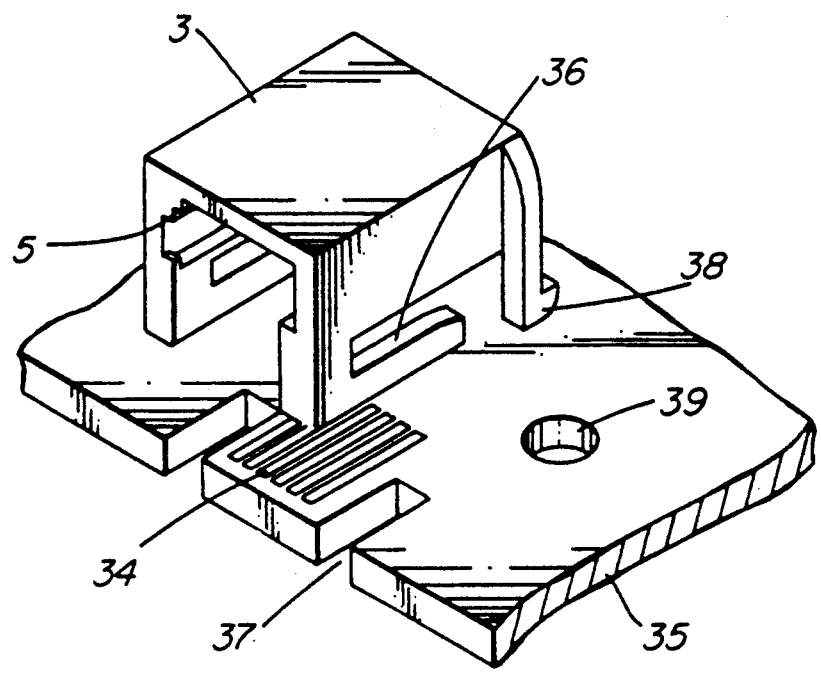

In FIG. 5 the housing 3 is adapted to receive an inserted connector body or plug (not shown) in a similar way to that in which the housing 23 of FIGS. 1 to 4 is adapted to receive two oppositely-directed connector bodies. The contacts of the inserted connector body in FIG. 5 are adapted to mate with conductive tracks 34 on a printed circuit board 35. The housing 3 is held in place against the board 35 at the front by means of lugs 36 passing into and under slots 37 in the edge of the board. The rear end of the housing is held in place by latches 38 on either side which lock into holes 39 in the board.

Figure 6:
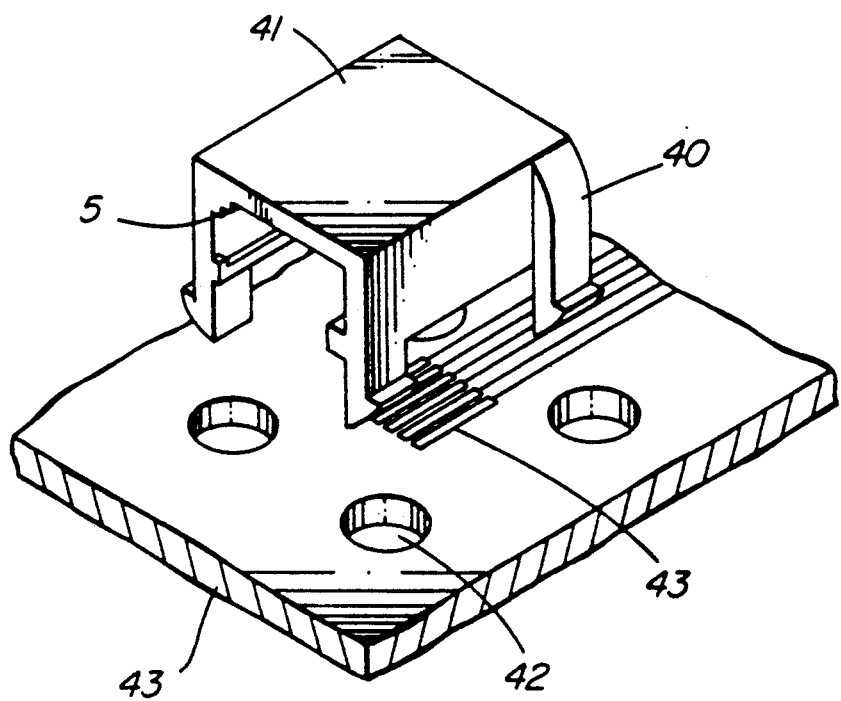

In FIG. 6 latches 40 are provided at either end of the housing 41 for insertion into holes 42 in the board 43.

In FIG. 7, the housing 44 is provided with slots 45 to slide onto the board 46 in a horizontal direction and is retained in position by retention pips or projections 47 engaging behind retention edges 48 at the entrance to slots 49 in the board.

In FIG. 8, the housing 50 is provided with longitudinal latches 51 engaging in slots 52 in the board 53, the housing being located relative to the board by dowels 54 engaging in holes 55 in the board 53.

Alternatively, the dowels could be omitted and the latches 8 extended to substantially the full length of the housing, the slots 52 being, of course, equally extended.

In each of the embodiments shown in FIGS. 5 to 8, a keyway or spline 5 is provided to ensure that the connector body or plug can only be inserted in the correct position for the contacts to engage.

We claim:

1. An electrical plug and socket connector for the connection of an external conductor to an electronic circuit installed on a planar base plate with printed circuitry, comprising:
   a hollow, generally rectangular gutter-shaped housing, with a U-shaped cross section, for reception of an inserted plug-in part, said housing having an open side facing the printed circuitry on one side of the base plate, a plate-like closed side opposite said open side, and a pair of opposing sidewalls integral with and extending from said plate-like closed side to form free ends directed toward the base plate;
   means for fastening the free ends of said sidewalls to the baseplate to thereby close said open side of said housing, said means for fastening comprising projections, extending from the free ends of said sidewalls, fitted into apertures or slots situated in the base plate; and
   a plug-in part with contact members installed thereon which extend from a side of the plug-in part to cooperate with opposed-contact members formed by printed circuitry on or in the base plate, said plug-in part including a surface on the side thereof opposite the side from which said contact members extend; and
   wherein the opposed-contact members are spaced from and bridged by said closed side of said housing in such a way that, with the introduction of the plug-in part into the housing, said plug-in part is inserted between said closed side of said housing and said opposed-contact members, and said surface of said plug-in part opposite said contact members cooperates with the inner surface of said plate-like closed side of said housing so that said contact members are brought into sliding contact with the opposed-contact members on the base plate.

2. A connector according to claim 1, wherein:
   said housing is detachable secured to one side of the base plate by said means for fastening so as to receive a single plug-in part having contact members thereon which cooperate with respective opposed-contacts on that side of the base plate; and
   said means for fastening comprises lugs at the plug-in part receiving end of the housing, which lugs engage in slots on the base plate; and
   latches at the other end of the housing which engage in holes in the base plate.

3. A connector according to claim 1, wherein:
   said housing is detachable secured to one side of the base plate by said means for fastening so as to receive a single plug-in part having contact members thereon which cooperate with respective opposed-contacts on that side of the base plate; and
   said means for fastening comprises latches, at the corners of the housing, which engage in holes in the base plate.

4. A connector according to claim 1, wherein:
   said housing is detachable secured to one side of the base plate by said means for fastening so as to receive a single plug-in part having contact members thereon which cooperate with respective opposed-contacts on that side of the base plate; and
   said means for fastening comprises slots in the housing fitting into slots in the base plate, projections being provided at the plug-in receiving end of the housing which co-operate with edges at the end of the slots in the base plate to prevent accidental separation.

5. A connector according to claim 1, wherein:
   said housing is detachably secured to one side of the base plate by said means for fastening so as to receive a single plug-in part having contact members thereon which cooperate with respective opposed-contacts on that side of the base plate; and
   said means for fastening comprises:
   elongated latches on either side of the housing fitting into parallel slots in the base plate; and
   dowels provided on the housing to fit into holes in the base plate to ensure correct alignment of the housing with the base plate.

* * * * *